United States Patent
Zhang et al.

(10) Patent No.: US 11,538,884 B2
(45) Date of Patent: Dec. 27, 2022

(54) ARRAY SUBSTRATE WITH SHORT CIRCUIT IN OVERLAPPING AREA OF SIGNAL LINES PREVENTED, ELECTROLUMINESCENT DISPLAY PANEL AND DISPLAY DEVICE

(71) Applicant: BOE Technology Group Co., Ltd., Beijing (CN)

(72) Inventors: Baoxia Zhang, Beijing (CN); Cuili Gai, Beijing (CN); Yicheng Lin, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 166 days.

(21) Appl. No.: 16/327,042

(22) PCT Filed: Mar. 22, 2018

(86) PCT No.: PCT/CN2018/079992
§ 371 (c)(1),
(2) Date: Feb. 21, 2019

(87) PCT Pub. No.: WO2018/219025
PCT Pub. Date: Dec. 6, 2018

(65) Prior Publication Data
US 2019/0189733 A1 Jun. 20, 2019

(30) Foreign Application Priority Data
Jun. 2, 2017 (CN) .......................... 201720633454.1

(51) Int. Cl.
*H01L 27/32* (2006.01)
*H01L 27/12* (2006.01)
*H01L 51/52* (2006.01)

(52) U.S. Cl.
CPC .......... *H01L 27/3276* (2013.01); *H01L 27/32* (2013.01); *H01L 27/3288* (2013.01);
(Continued)

(58) Field of Classification Search
CPC . H01L 27/3276; H01L 27/32; H01L 27/3288; H01L 27/1244; H01L 51/524; H01L 2251/5392
(Continued)

(56) References Cited

U.S. PATENT DOCUMENTS 5,841,490 A * 11/1998 Matsuo ............... H01L 27/1244
349/40
7,250,720 B2 * 7/2007 Sakakura ................ H01L 27/12
257/E27.111
(Continued)

FOREIGN PATENT DOCUMENTS

| CN | 101577280 A | 11/2009 |
|----|-------------|---------|
| CN | 101887904 A | 11/2010 |

(Continued)

OTHER PUBLICATIONS

International Search Report (including English translation of Search Report) and Written Opinion (including English translation of Box V) for International Application No. PCT/CN2018/079992, dated Jun. 28, 2018, 17 pages.

*Primary Examiner* — Lex H Malsawma
*Assistant Examiner* — Eric W Jones
(74) *Attorney, Agent, or Firm* — Westman, Champlin & Koehler, P.A.

(57) ABSTRACT

An array substrate, an electroluminescent display panel, and a display device are disclosed. The array substrate includes: a base substrate, and a first signal line, an insulating layer and a second signal line provided sequentially on the base substrate in a direction perpendicular to the base substrate; wherein the first signal line has a first portion and a second portion, the first portion has a resistance higher than a resistance of the second portion, and at least a part of the first portion is overlapped with the second signal line, and the
(Continued)

second portion is non-overlapped with the second signal line.

16 Claims, 7 Drawing Sheets

(52) U.S. Cl.
CPC ........ *H01L 27/1244* (2013.01); *H01L 51/524* (2013.01); *H01L 2251/5392* (2013.01)

(58) Field of Classification Search
USPC ..................................................... 257/40, 59
See application file for complete search history.

(56) References Cited

U.S. PATENT DOCUMENTS

| | | |
|---|---|---|
| 8,541,785 B2 | 9/2013 | Hosoya et al. |
| 9,804,720 B2 | 10/2017 | Liu |
| 2002/0159016 A1* | 10/2002 | Nishida ............. G02F 1/134363 349/141 |
| 2003/0111954 A1* | 6/2003 | Koo .................... H01L 27/3276 313/498 |
| 2005/0116232 A1* | 6/2005 | Kim .................... H01L 27/1288 257/72 |
| 2006/0267491 A1* | 11/2006 | Koo .................... H01L 27/3265 313/511 |
| 2009/0206342 A1 | 8/2009 | Hosoya et al. |
| 2010/0201658 A1* | 8/2010 | Koshiishi ............ H01L 27/3276 345/205 |
| 2011/0068707 A1* | 3/2011 | Kubota ............... H01L 27/1255 315/291 |
| 2013/0292795 A1* | 11/2013 | Pyon ................... H01L 27/1255 257/532 |
| 2013/0334535 A1* | 12/2013 | Kimura ................ G09G 3/3233 257/59 |
| 2016/0149044 A1* | 5/2016 | Noda ................ H01L 29/78696 257/43 |
| 2016/0274693 A1 | 9/2016 | Liu |
| 2019/0189733 A1 | 6/2019 | Zhang et al. |

FOREIGN PATENT DOCUMENTS

| | | |
|---|---|---|
| CN | 104460150 A | 3/2015 |
| CN | 106033765 A | 10/2016 |
| CN | 106816457 A | 6/2017 |
| CN | 206711895 U | 12/2017 |

\* cited by examiner

ARRAY SUBSTRATE WITH SHORT CIRCUIT IN OVERLAPPING AREA OF SIGNAL LINES PREVENTED, ELECTROLUMINESCENT DISPLAY PANEL AND DISPLAY DEVICE

CROSS-REFERENCE TO RELATED APPLICATION

This application is a Section 371 National Stage Application of International Application No. PCT/CN2018/079992, filed on Mar. 22, 2018, entitled "Array Substrate, Electroluminescent Display Panel and Display Device", which published as WO 2018/219025 A1on 6 Dec. 2018, which claims priority to Chinese Application No. 201720633454.1, filed on 2 Jun. 2017 with CNIPA, incorporated herein by reference in their entirety.

TECHNICAL FIELD

The present disclosure relates to display technical field, more particularly, to an array substrate, an electroluminescent display panel and a display device.

BACKGROUND

An Organic Light Emitting Diode (OLED) display panels, according to driving modes, may be divided into Passive Matrix OLED (PMOLED) display panel and Active Matrix OLED (AMOLED) display panel. The AMOLED display panel has pixels arranged in an array, belongs to an active display type, has advantages of high emission efficiency, high contrast, wide visual angle, and the like, and is generally applied to a high-resolution display device with large scale.

SUMMARY

An embodiment of the present disclosure provides an array substrate, including: a base substrate; and a first signal line, an insulating layer and a second signal line provided sequentially on the base substrate in a direction perpendicular to the base substrate, wherein the first signal line has a first portion and a second portion, the first portion having a resistance higher than a resistance of the second portion, at least a part of the first portion being overlapped with the second signal line, and the second portion non-overlapped with the second signal line.

In some embodiments, the first portion of the first signal line includes a portion of the first signal line completely overlapped with the second signal line.

In some embodiments, the first portion of the first signal line is completely overlapped with the second signal line.

In some embodiments, the first portion of the first signal line has a smaller thickness than the second portion of the first signal line.

In some embodiments, the insulating layer has a same thickness at a location on the first portion of the first signal line as that at a location on the second portion of the first signal line.

In some embodiments, the first portion of the first signal line includes a first extension overlapped with the second signal line and extending in a widthwise direction of the first portion, and the second signal line includes a second extension overlapped with the first signal line and extending in a widthwise direction of the second signal line; wherein an orthographic projection of the first extension onto the base substrate has an area overlapped with an orthographic projection of the second extension onto the base substrate.

In some embodiments, the first extension has a same thickness as the portion of the first signal line completely overlapped with the second signal line.

In some embodiments, the orthographic projections of the first extension and the second extension onto the base substrate are partly overlapped with each other.

In some embodiments, the array substrate further includes a metal electrode connected with the first extension or the second extension, wherein an orthographic projection of the metal electrode onto the base substrate is at most overlapped with the orthographic projection of one of the first extension and the second extension onto the based substrate.

In some embodiments, the metal electrode is located between a layer where the first signal line is located and the insulating layer; and the meal electrode is electrically connected with the first extension.

In some embodiments, the metal electrode is located between the insulating layer and a layer where the second signal line is located; and the meal electrode is electrically connected with the second extension.

In some embodiments, the first signal line is a low-level voltage signal line, and the second signal line is a high-level voltage signal line.

An embodiment of the present disclosure further provides an electroluminescent display panel, including the array substrate as described in any one of the above embodiments.

An embodiment of the present disclosure further provides a display device, including the electroluminescent display panel as described in any one of the above embodiments.

DETAILED DESCRIPTION OF EMBODIMENTS

Detailed descriptions of an array substrate, an electroluminescent display panel and a display device provided by embodiments of the present disclosure will be described in detail with reference to the drawings. It is apparent that the described embodiments are only a part of the embodiments of the present disclosure, rather than all the embodiment of the present disclosure. On the basis of the embodiments of the present disclosure, all of other embodiments that can be obtained by the skilled person in the art without any creative efforts also belong to the scope of the present disclosure.

The inventors have recognized: with the development of the integrated and ultrathin display devices, a thickness of each film layer on the array substrate in the AMOLED display, especially a thickness of an insulating film layer, tends to a limit, which inevitably causes a decrease in quality of the resulting insulating film layer. When signal lines on upper and lower surfaces of the insulating film layer are respectively inputted into a signal with a large voltage difference, especially the largest voltage difference between a high-level voltage signal VDD and a low-level voltage signal VSS, the signals are easy to break down the insulating layer in an area intersecting with the signal lines, causing an occurrence of a short circuit between the upper and lower signal lines so as to affect the display effect.

Figure 1A:
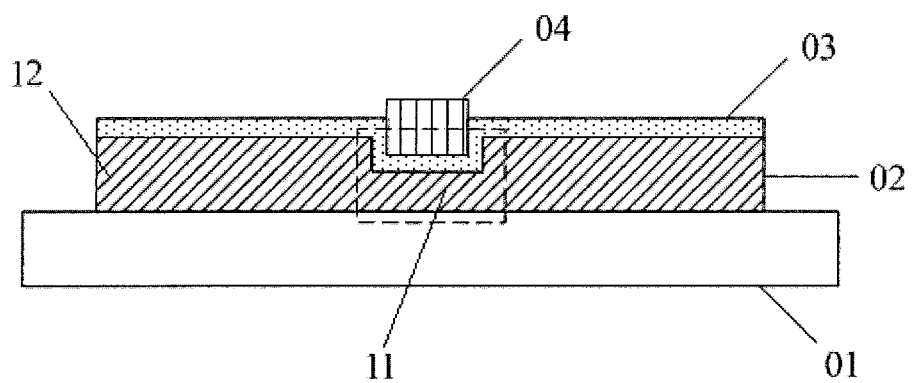
FIGS. 1A and 1B are side views of an array substrate provided in an embodiment of the present disclosure, respectively.
Figure 1B:
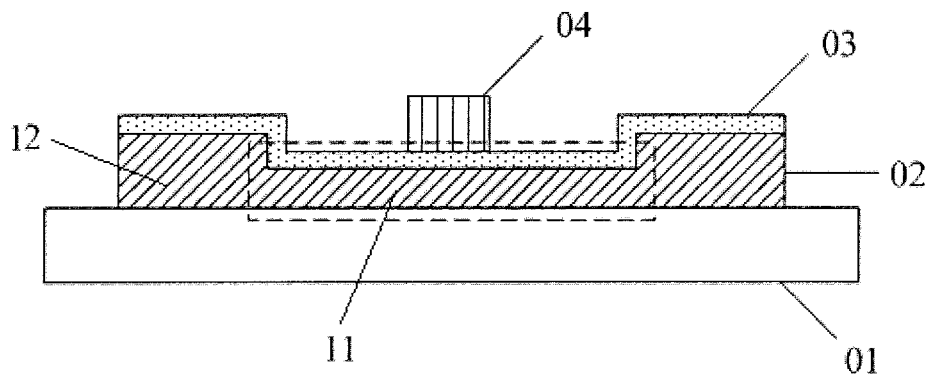

An embodiment of the present disclosure provides an array substrate, as shown in the side views of FIGS. 1A and 1B, including: a base substrate 01 (a white-filled area), and a first signal line 02 (a slash-filled area), an insulating layer 03 (a black dot-filled area) and a second signal line 04 (a vertical line-filled area) provided sequentially on the base substrate 01 in a direction perpendicular to the base substrate 01; and the first signal line 02 intersects with the second signal line 04. The first signal line 02 has a first portion 11 and a second portion 12. A resistance of the first portion 11 is higher than that of the second portion 12. At least a part of the first portion 11 overlaps with the second signal line 04, but the second portion 12 does not overlap with the second signal line 04. In other words, a portion of the first signal line 02 completely overlapped with the second signal line 04 is provided in the first portion 11. The first portion 11 may only include the portion of the first signal line 02 completely overlapped with the second signal line 04 in the direction perpendicular to the base substrate. Alternatively, the first portion 11 may also include other portions, for example, portions adjacent to the portion of the first signal line 02 completely overlapped with the second signal line 04. Herein, for example, an orthographic projection of the portion of the first signal line 02 completely overlapped with the second signal line 04 onto the base substrate 01 completely falls within an orthographic projection of the second signal line 04 onto the base substrate 01.

As an example, the resistance of the first portion 11 of the first signal line 02 may be greater than that of other portions of the first signal line 02.

In the above-mentioned array substrate provided by an embodiment of the present disclosure, in order to prevent short circuit in the overlapping area (or intersecting area) of the first and second signal lines located on the upper and lower surfaces of the insulating layer respectively, the resistance of the first portion 11 of the first signal line including the overlapping area is arranged to be greater than that of a non-overlapping portion (for example, the second portion 12) of the first signal line. That is, the resistance of the first portion of the first signal line is increased, such that a high resistance region is formed in the portion of the first signal line overlapped with the second signal line, and thus the current in the second signal line is slowed down when it flows through the overlapping area. This avoids a short circuit between the first and second signal lines due to the breakdown of the insulating layer caused by large transient current in the overlapping area flowing through the insulating layer, so as to effectively reduce the probability of the first signal line and the second signal line being short-circuited in the intersecting area, thereby improving the quality of the display picture.

Specifically, in order to effectively avoid the occurrence of a short circuit between the first signal line and the second signal line, generally, a range of the high resistance region is set to be larger than the area where the first signal line and the second signal line are completely overlapped with each other, as shown in a dashed box of FIG. 1B. Of course, as shown in a dashed box of FIG. 1A, it may also be that the range of the high resistance region is equal to the range in which the first and second signal lines are completely overlapped with each other, which is not limited herein.

It should be noted that, generally in an electroluminescent display panel, a signal line for transmitting signals on an array substrate is usually made of a transparent conductive oxide such as indium tin oxide (ITO). However, it is well known that in the event that ITO is used to form the signal line for transmitting a signal, its own resistance is much higher than resistance of metal. Therefore, normally, in order to improve the conductive property of the ITO signal line, the signal line may customarily be made thicker, that is, the greater the thickness is, the less the resistance becomes, and the better the conductive property becomes; alternatively, the thinner the thickness is, the greater the resistance becomes and the poorer conductive property becomes.

In a specific implementation, in the electroluminescent display panel, especially in the OLED display panel, a plurality of signal lines for transmitting a low-level voltage (such as VSS) and a plurality of signal lines for transmitting a high-level voltage (such as VDD) are typically arranged on the array substrate. The plurality of signal lines for transmitting the low-level voltage and a plurality of signal lines for transmitting the high-level voltage provide holes and electrons for a light emitting layer for emitting light in the array substrate, respectively. The holes and electrons are recombined in the light emitting layer to emit light, thereby achieving the display. Therefore, in the above array substrate provided by an embodiment of the present disclosure, the first signal line 02 may be a low-level voltage signal line, that is, VSS, and the second signal line 04 may be a high-level voltage signal line, that is, VDD.

Specifically, in the OLED display panel, when the first signal line 02 is the low-level voltage signal line and the second signal line 04 is the high-level voltage signal line, the first signal line 02 and the second signal line 04 are generally formed of a transparent conductive oxide (such as ITO). Therefore, in order to realize that the resistance of the portion of the first signal line 02 overlapped with the second signal line is greater than the resistance of the non-overlapping portion, in the above-mentioned array substrate provided by an embodiment of the present disclosure, the thickness of the first portion 11 of the first signal line is smaller than that of the second portion 12 of the first signal line. By thinning the thickness of the first portion 11 of the first signal line 02, the resistance of the overlapping portion of the first signal line 02 is increased, and thus a high resistance region is formed, as shown in FIGS. 1A and 1B.

Specifically, since the insulating layer is only used to insulate the first signal line 02 from the second signal line 04, the thickness of the insulating layer is generally uniformly disposed, that is, the thickness is kept uniform. Therefore, in the above-mentioned array substrate provided by an embodiment of the present disclosure, the insulating layer has the same thickness at a location on the first portion of the first signal line as the thickness of the insulating layer at a location on the second portion of the first signal line. As an example, as shown in FIGS. 1A and 1B, the thickness of the insulating layer 03 is kept uniform.

In a specific implementation, in order to slow down the flow velocity of the current in the second signal line flowing through the overlapping area, a buffer capacitor may be formed in the overlapping area to slow down the flow of the current. Specifically, in the above-mentioned array substrate provided by an embodiment of the present disclosure, the part of the first portion of the first signal line overlapped with the second signal line has a first extension, and part of the second signal line overlapped with the first signal line has a second extension. The first extension extends in a widthwise direction of the first portion, and the second extension extends in a widthwise direction of the second signal line.

An orthographic projection of the first extension onto the base substrate has an overlapping area overlapped with an orthographic projection of the second extension onto the base substrate.

As an example, the first extension has the same thickness as the portion of the first signal line completely overlapped with the second signal line.

Figure 2A:
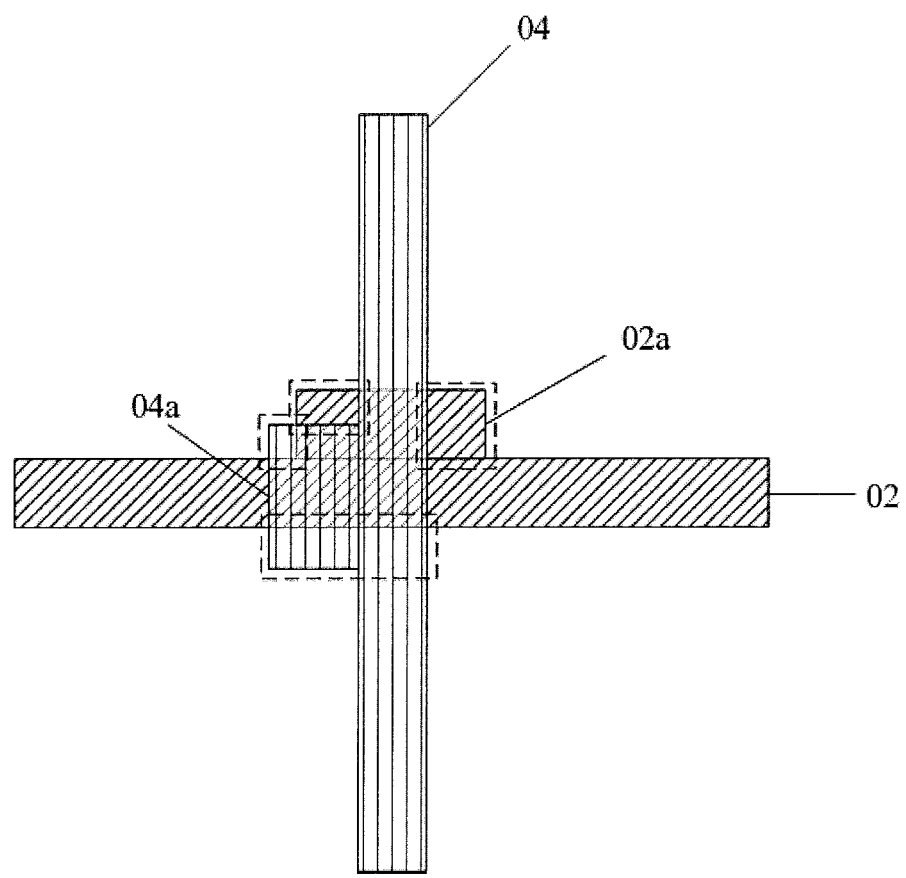
FIGS. 2A to 2D are top views of a first signal line and a second signal line provided in an embodiment of the present disclosure, respectively.
Figure 2B:
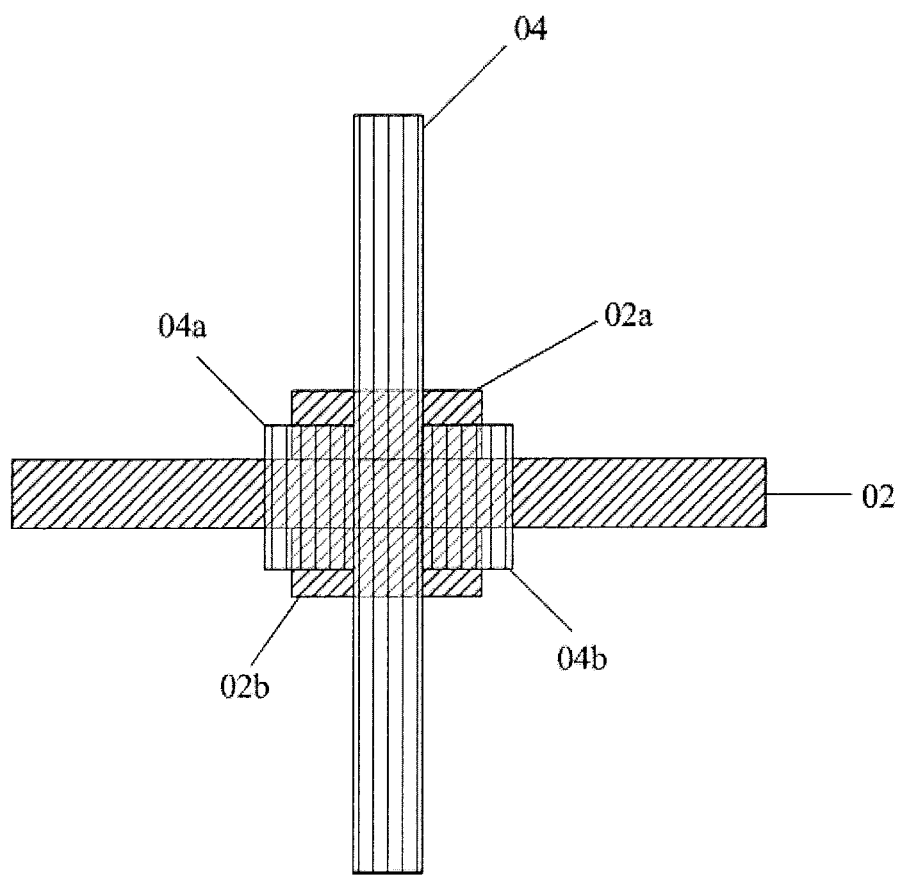
Figure 2C:
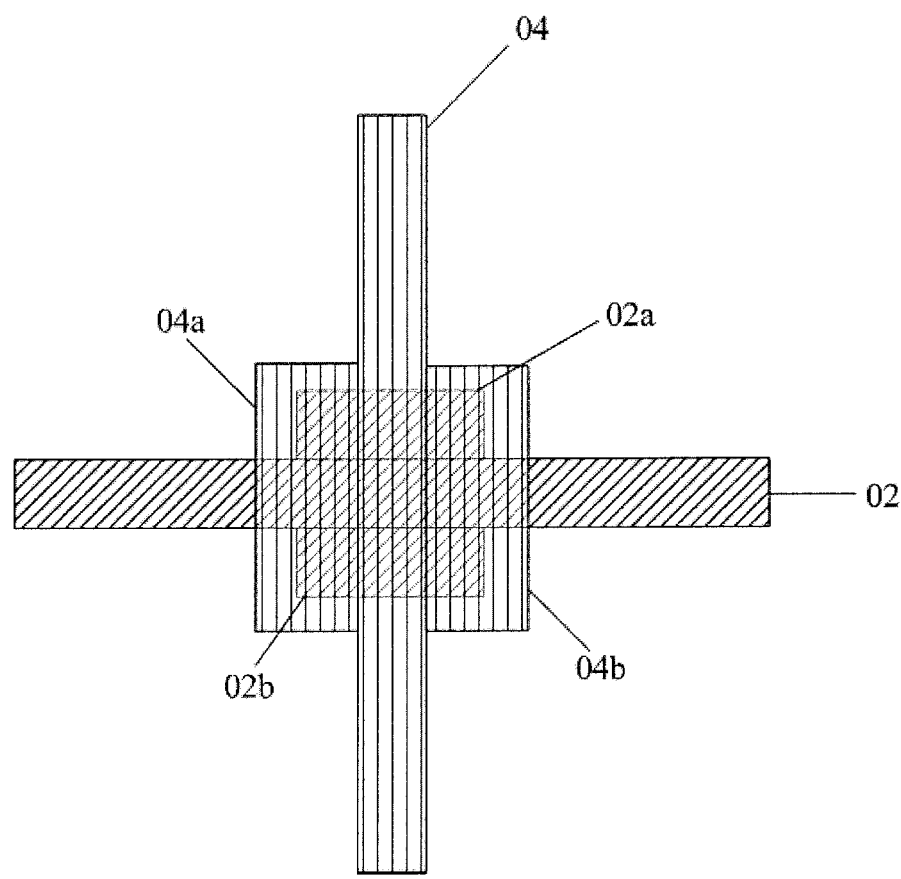
Figure 2D:
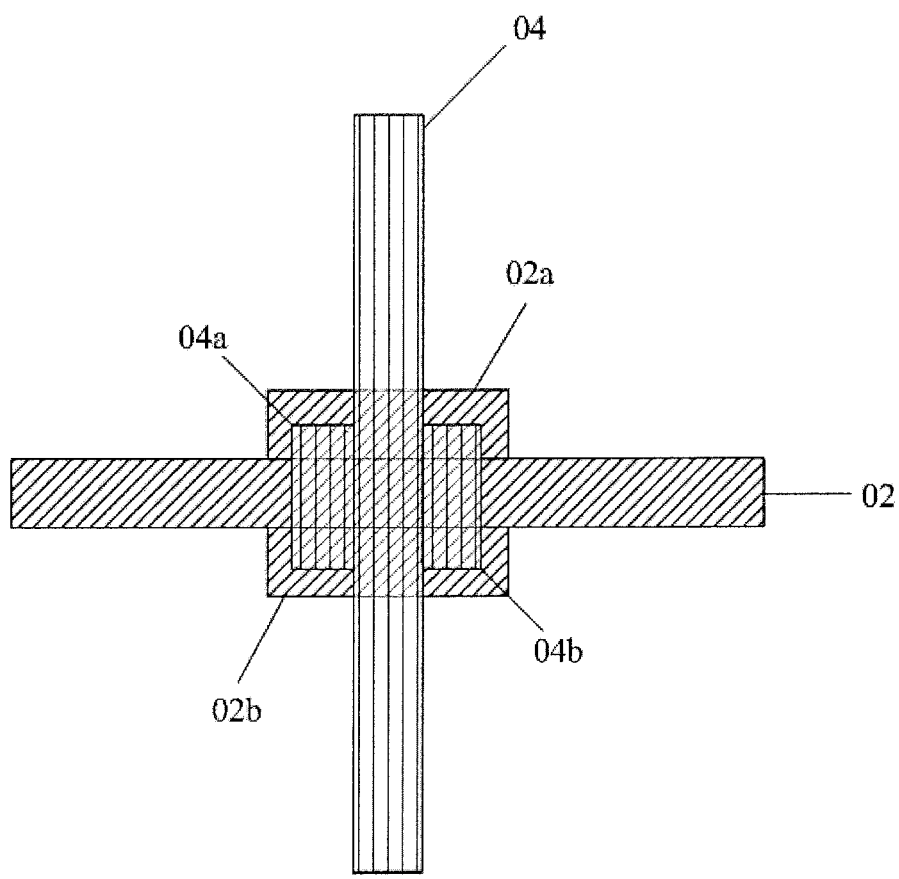

As an example, as shown in FIG. 2A to FIG. 2D, for the convenience of display, the position of the insulating layer is not shown in the figures. The first portion 11 of the first signal line 02 may have one first extension (a first extension 02a as shown in FIG. 2A), and may also have two first extensions (a first extension 02a and a first extension 02b as shown in FIGS. 2B to 2D). A shape of the first extension portion (including the first extension 02a and the first extension 02b) may be square (as shown in FIGS. 2A to 2D), and may also be semi-circular or triangular. Of course, other shapes may be used, which are not limited herein.

Specifically, as shown in FIG. 2A to FIG. 2D, the part of the second signal line 04 overlapped with the first signal line may also have one second extension (a second extension 04a as shown in FIG. 2A), and may also have two second extensions (a second extension 04a and a second extension 04b as shown in FIGS. 2B to 2D). And, for example, the second extension (including the second extension 04a and the second extension 04b) may have the same shape as the first extension (as shown in FIGS. 2A to 2D), alternatively may have a shape different from that of the first extension as long as it is ensured that orthographic projections of the first and second extensions onto the base substrate have an overlapping area to form a buffer capacitor, which is not limited herein.

As an example, a relationship between the first extension and the second extension may be as shown in FIGS. 2A to 2D. The orthographic projection of the first extension (including the first extension 02a and the first extension 02b) onto the base substrate may have a partly overlapping area with the orthographic projection of the second extension (including the second extension 04a and the second extension 04b) onto the base substrate, as shown in FIGS. 2A and 2B. Of course, the orthographic projection of the first extension (including the first extension 02a and the first extension 02b) onto the base substrate may also be completely enclosed by the orthographic projection of the second extension (including the second extension 04a and the second extension 04b) onto the base substrate, as shown in FIG. 2C. Of course, the orthographic projection of the first extension (including the first extension 02a and the first extension 02b) onto the base substrate may also completely enclose the orthographic projection of the second extension (including the second extension 04a and the second extension 04b) onto the base substrate, as shown in FIG. 2D. Specifically, it may be designed accordingly as required, which is not specifically limited herein.

Further, since the first signal line and the second signal line respectively have extensions, a buffer capacitor may be formed between the first extension and the second extension, so that the flow velocity of the current in the second signal line may be slowed down when the current flows through the intersecting area, reducing the probability that the first signal line and the second signal line are short-circuited in the intersecting area. However, the formation of the buffer capacitor in fact increases the area of the area of the first signal line overlapped with the second signal line, thereby increasing an area where the current flows, which actually has a certain conflict with the role of the high resistance region. In order to avoid such conflict and to fully utilize the roles of the high resistance region and the buffer capacitor, it is required to simulate the extent where the first signal line is thinned in the intersecting area and the area of the buffer capacitor to obtain an optimal solution to finally reduce the probability of the first signal line and the second signal line being short-circuited in the intersecting area. Consequently, the extent where the first signal line is thinned in the intersecting area and the area of the buffer capacitor are not specifically limited herein.

In the specific implementation, when the first signal line and the second signal line are made of a transparent conductive oxide (such as ITO), since the resistance of the transparent conductive oxide is great, it is easy to cause great voltage difference when the current flows through the signal lines, to affect the light-emitting effect, and thus affecting the display effect. In order to avoid this situation, for example, a metal electrode may be fabricated on the surface of the first signal line or the second signal line as an auxiliary electrode to reduce the voltage difference. Meanwhile, in order not to affect the roles of the high resistance region and the buffer capacitor that the velocity of the current in the second signal line is slowed down in the overlapping area and the probability of the first signal line and the second signal line being short-circuited in the overlapping area is lowered, in the above-mentioned array substrate provided by an embodiment of the present disclosure, as an example, when the orthographic projections of the first extension and the second extension onto the base substrate are only partially overlapped with each other, the array substrate may further include: a metal electrode disposed on and outside the overlapping area (i.e., an orthographic projection of the metal electrode onto the base substrate is at most overlapped with the orthographic projection of one of the first signal line 02 and the second signal line 04 onto the base substrate, or the orthographic projection of the metal electrode onto the base substrate may be overlapped with the orthographic projection of the first signal line 02 onto the base substrate, or may be overlapped with the orthographic projection of the second signal line 04 onto the base substrate, or may be overlapped with none of the orthographic projections of the first signal line 02 and the second signal line 04 onto the base substrate), and the metal electrodes are connected with the first extension or the second extension. As shown in FIG. 2A, the metal electrode may be generally located in the non-intersecting area, the non-overlapping area, and a non-overlapping area of the second extension 04a with the first signal line 02. That is, the metal electrode may be located within the dashed box, such that in the case of ensuring the roles of the high resistance region and the buffer capacitor, the role of the metal electrode may be realized in order to prevent mutual interference therebetween.

Figure 3A:
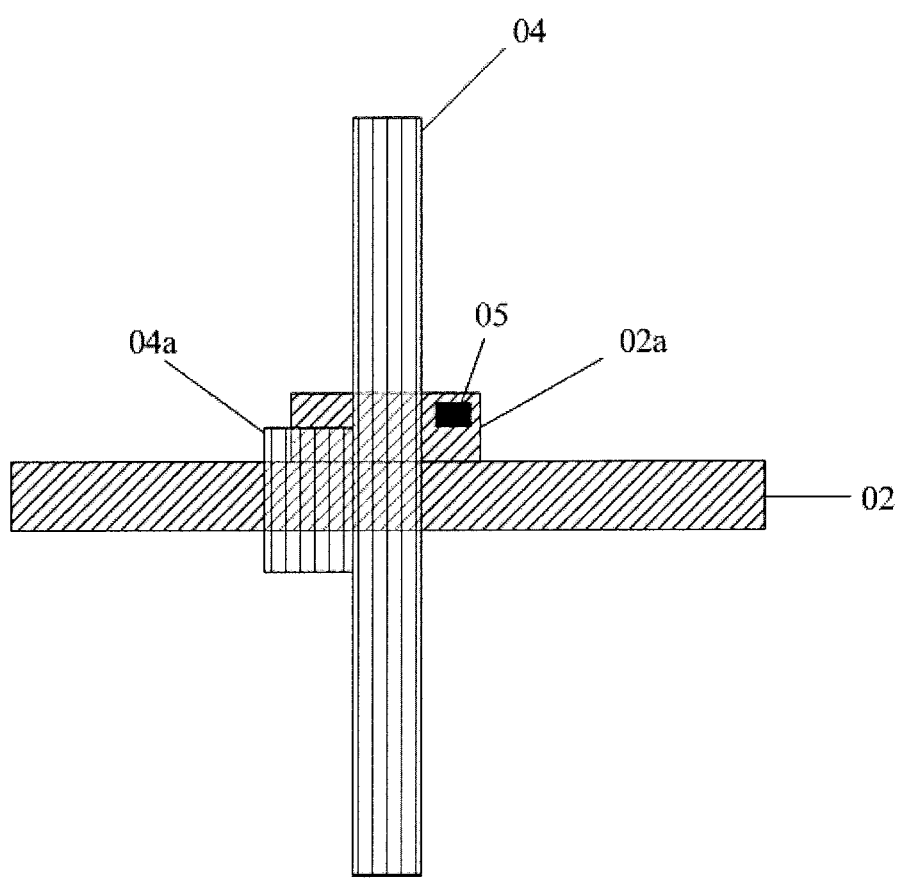
FIGS. 3A and 3B are schematic views showing positions of metal electrodes provided in an embodiment of the present disclosure, respectively.

Specifically, in the above-mentioned array substrate provided by an embodiment of the present disclosure, the metal electrode may be disposed between a layer where the first signal line is located and a layer where the second signal line is located (for example, a film layer between the layer where the first signal line is located and the layer where the second signal line is located) and may be electrically connected with the first signal line or the second signal line according to a specific position; wherein when the metal electrode 05 is located between the layer where the first signal line 02 is located and the insulating layer 03 (for example, the film layer between the layer where the first signal line 02 is located and the insulating layer 03), as shown in FIG. 3A, the metal electrode 05 (a black-filled area) is electrically connected with the first extension 02a.

Figure 3B:
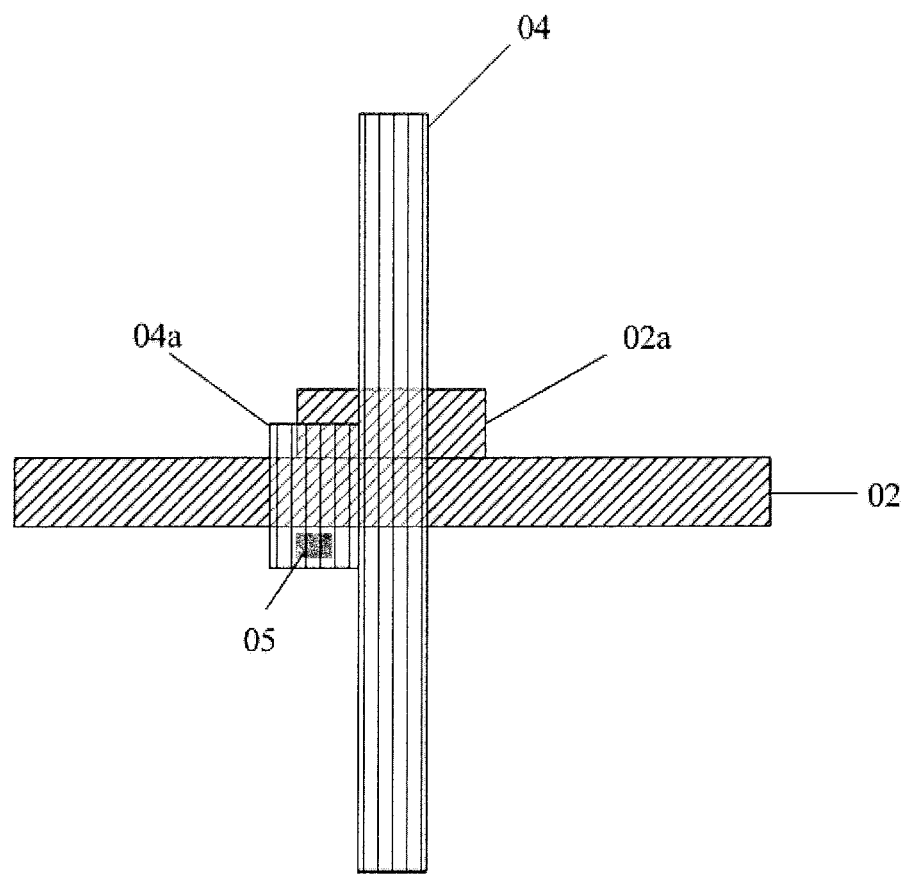

Alternatively, in the above-mentioned array substrate provided by an embodiment of the present disclosure, when the metal electrode 05 is located between the insulating layer 03 and the layer where the second signal line 04 is located (for example, the film layer between the insulating layer 03 and the layer where the first signal line 04 is located), as shown in FIG. 3B, the metal electrode 05 (a black-filled area) is electrically connected with the second extension 04a.

Of course, the metal electrode is not limited to be disposed in the film layer between the layer where the first signal line is located and the layer where the second signal line is located, and may be disposed at other positions as required, which is not limited herein.

Figure 4:
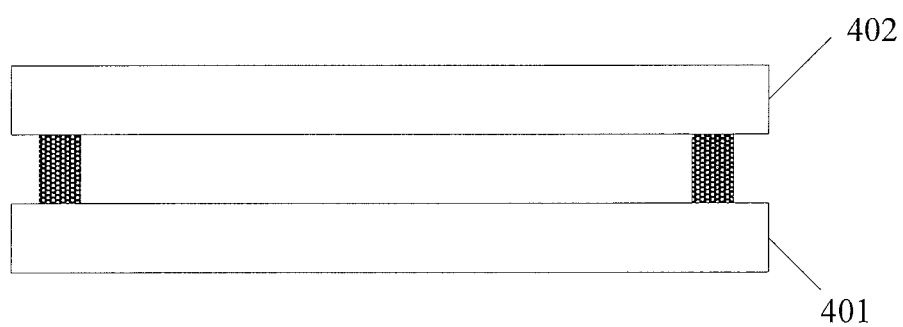
FIG. 4 is a schematic view showing a structure of an electroluminescent display panel provided in an embodiment of the present disclosure.

On the basis of the same concept, an embodiment of the present disclosure further provides an electroluminescent display panel. As shown in FIG. 4, it may include: the above array substrate 401 provided in an embodiment of the present disclosure, and may include a package substrate 402 disposed opposite to the array substrate. As an example, the array substrate 401 may be fixed with the package substrate 402 by, for example, glue bonding or mechanical connector.

On the basis of the same concept, an embodiment of the present disclosure further provides a display device. It may include the above electroluminescent display panel as provided by an embodiment of the present disclosure. The display device may be a mobile phone, a tablet computer, a television, a display, a notebook computer, a digital camera, a navigator, or any product or component having a display function. The specific implementation may make reference to the descriptions for the above-mentioned electroluminescent display panel provided by the embodiment of the present disclosure. The same contents will not be repeated.

Embodiments of the present disclosure provide an array substrate, an electroluminescent display panel, and a display device. The array substrate includes: a base substrate, and a first signal line, an insulating layer and a second signal line provided sequentially on the base substrate; the first signal line has a first portion and a second portion, the resistance of the first portion is higher than that of the second portion. At least a part of the first portion is overlapped with the second signal line, and the second portion is not overlapped with the second signal line. In order to prevent a short circuit in the overlapping area of the first and second signal lines located on the upper and lower surfaces of the insulating layer, the resistance of the first portion of the first signal line including the overlapping area may be arranged to be greater than that of a non-overlapping portion of the first signal. That is, the resistance of the overlapping area of the first signal line is increased, such that a high resistance region is formed in the overlapping area of the first signal line with the second signal line, and thus the flow velocity of the current in the second signal line is slowed down when the current flows through the overlapping area. This efficiently avoids a short circuit between the first and second signal lines due to the breakdown of the insulating layer caused by large transient current in the overlapping area flowing through the insulating layer, so as to effectively reduce the probability of short-circuit of the first signal line and the second signal line in the intersecting area, thereby improving the quality of the display picture.

It would be apparent by those skilled in the art that various modifications and variations may be made to these embodiments of the present disclosure without departing from the principle and scope of the present disclosure. In this way, if the modifications and variations made to the present disclosure belong to the scope of which is defined in the claims and their equivalents, the present disclosure is intended to encompass the modifications and variations.

What is claimed is:

1. An array substrate, comprising:
a base substrate; and
a first signal line, an insulating layer and a second signal line provided sequentially on the base substrate in a direction perpendicular to the base substrate, wherein the first signal line is disposed between the base substrate and the insulating layer, the second signal line is disposed on a side of the insulatin facing away from the first signal line, and the first signal line and the second signal line cross each other,
wherein the first signal line has a first portion and a second portion integral with each other, at least a part of the first portion is overlapped with the second signal line in an overlapping area, the second portion is not overlapped with the second signal line, and the first portion has a resistance higher than a resistance of the second portion to avoid a short circuit between the first and second signal lines due to a breakdown of the insulating layer in the overlapping area, and
wherein the first portion of the first signal line has a smaller thickness in the direction perpendicular to the base substrate than the second portion of the first signal line, such that the first portion extends across an entire width of the first signal line in a width direction of the first signal line,
wherein an orthographic projection of the first signal line onto the base substrate has an overlapping section and non-overlapping sections, an orthographic projection of the second signal line onto the base substrate has an overlapping section and non-overlapping sections, the overlapping section of the first signal line and the overlapping section of the second signal line coincides with each other, the non-overlapping sections of the first signal line are not overlapped with the non-overlapping sections of the second signal lines, the non-overlapping sections of the first signal line are located on two opposite sides of the overlapping section of the first signal line, respectively, and the non-overlapping sections of the second signal lines are located on two opposite sides of the overlapping section of the second signal line, respectively,
wherein a length, along a length direction of the first signal line, of first portion of the first signal line is smaller than a length, along the length direction of the first signal line, of the second portion of the first signal line,
wherein the insulating layer has a same thickness at a surface, facing away from the base substrate, of the first portion of the first signal line as that at a surface, facing away from the base substrate, of the second portion of the first signal line, and
wherein a surface of the second signal line facing towards the base substrate is closer to the base substrate than the surface facing away from the base substrate, of the second portion of the first signal line.

2. The array substrate as claimed in claim 1, wherein the first portion of the first signal line comprises a portion of the first signal line completely overlapped with the second signal line.

3. The array substrate as claimed in claim 1, wherein the first portion of the first signal line is completely overlapped with the second signal line.

4. The array substrate as claimed in claim 1, wherein the first portion of the first signal line comprises a first extension overlapped with the second signal line and extending in a widthwise direction of the first portion, and the second signal line comprises a second extension overlapped with the first signal line and extending in a widthwise direction of the second signal line;
   wherein an orthographic projection of the first extension onto the base substrate has an area overlapped with an orthographic projection of the second extension onto the base substrate.

5. The array substrate as claimed in claim 4, wherein the first extension has a same thickness as the portion of the first signal line completely overlapped with the second signal line.

6. The array substrate as claimed in claim 4, wherein the orthographic projections of the first extension and the second extension onto the base substrate are partly overlapped with each other.

7. The array substrate as claimed in claim 6, further comprising a metal electrode connected with the first extension or the second extension, wherein an orthographic projection of the metal electrode onto the base substrate is at most overlapped with the orthographic projection of one of the first extension and the second extension onto the based substrate.

8. The array substrate as claimed in claim 7, wherein the metal electrode is located between a layer where the first signal line is located and the insulating layer; and the meal electrode is electrically connected with the first extension.

9. The array substrate as claimed in claim 7, wherein the metal electrode is located between the insulating layer and a layer where the second signal line is located; and the meal electrode is electrically connected with the second extension.

10. The array substrate as claimed in claim 1, wherein the first signal line is a low-level voltage signal line, and the second signal line is a high-level voltage signal line.

11. An electroluminescent display panel comprising the array substrate as claimed in claim 1.

12. A display device comprising the electroluminescent display panel as claimed in claim 11.

13. The electroluminescent display panel as claimed in claim 11, wherein the first portion of the first signal line comprises a portion of the first signal line completely overlapped with the second signal line.

14. The electroluminescent display panel as claimed in claim 11, wherein the first portion of the first signal line is completely overlapped with the second signal line.

15. The electroluminescent display panel as claimed in claim 11, wherein the first portion of the first signal line comprises a first extension overlapped with the second signal line and extending in a widthwise direction of the first portion, and the second signal line comprises a second extension overlapped with the first signal line and extending in a widthwise direction of the second signal line;
   wherein an orthographic projection of the first extension onto the base substrate has an area overlapped with an orthographic projection of the second extension onto the base substrate.

16. The electroluminescent display panel as claimed in claim 15, wherein the orthographic projections of the first extension and the second extension onto the base substrate are partly overlapped with each other, and wherein the array substrate further comprises a metal electrode connected with the first extension or the second extension, wherein an orthographic projection of the metal electrode onto the base substrate is at most overlapped with the orthographic projection of one of the first extension and the second extension onto the based substrate.

* * * * *